(12) United States Patent
Fu et al.

(10) Patent No.: US 11,929,371 B2
(45) Date of Patent: Mar. 12, 2024

(54) ARRAY SUBSTRATE, DISPLAY PANEL AND DISPLAY APPARATUS

(71) Applicants: Beijing BOE Display Technology Co., Ltd., Beijing (CN); BOE Technology Group Co., Ltd., Beijing (CN)

(72) Inventors: Bangran Fu, Beijing (CN); Huabin Chen, Beijing (CN); Yingqiang Gao, Beijing (CN); Liqiang Li, Beijing (CN); Yongzhi Song, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 377 days.

(21) Appl. No.: 17/485,136

(22) Filed: Sep. 24, 2021

(65) Prior Publication Data
US 2022/0157857 A1    May 19, 2022

(30) Foreign Application Priority Data

Nov. 13, 2020    (CN) .................... 202011267226.X

(51) Int. Cl.
| | | |
|---|---|---|
| *H01L 27/12* | (2006.01) | |
| *G02F 1/1333* | (2006.01) | |
| *G02F 1/1343* | (2006.01) | |
| *G02F 1/1362* | (2006.01) | |
| *G02F 1/1368* | (2006.01) | |

(52) U.S. Cl.
CPC .... *H01L 27/1244* (2013.01); *G02F 1/133345* (2013.01); *G02F 1/134309* (2013.01); *G02F 1/136286* (2013.01); *G02F 1/1368* (2013.01)

(58) Field of Classification Search
CPC ......... G02F 1/133345; G02F 1/134309; G02F 1/136286; G02F 1/1368; H01L 27/1244
USPC .......................................................... 349/43
See application file for complete search history.

(56) References Cited

U.S. PATENT DOCUMENTS

2020/0335053 A1* 10/2020 Yoshida ............... G02F 1/1368

* cited by examiner

*Primary Examiner* — Edward J Glick
*Assistant Examiner* — William D Peterson
(74) *Attorney, Agent, or Firm* — IPro, PLLC

(57) ABSTRACT

Disclosed are an array substrate, a display panel and a display apparatus. The array substrate includes: gate lines, data lines, and pixel units. The gate lines and the data lines are arranged between at least part of the adjacent pixel units. The array substrate further includes: common electrode lead wires and common electrode layers. The common electrode lead wires are arranged on a same layer as the data lines, extend in a same direction as the data lines, and are located between at least part of the adjacent pixel units. The common electrode layers are insulated from the common electrode lead wires through insulating layers and are connected with the common electrode lead wires through via holes in the insulating layers. The via holes are located in a region where the gate lines and the common electrode lead wires intersect.

17 Claims, 4 Drawing Sheets

ARRAY SUBSTRATE, DISPLAY PANEL AND DISPLAY APPARATUS

This application claims priority to Chinese Patent Application No. 202011267226.X, filed on Nov. 13, 2020, which is hereby incorporated by reference in its entirety.

FIELD

The disclosure relates to the field of display, in particular to an array substrate, a display panel and a display apparatus.

BACKGROUND

When a display panel is manufactured and used, static electricity will accumulate for various reasons. When the static electricity accumulates to a certain extent, it will be released in a place where an anti-static ability of the panel is weak, resulting in a series of display abnormalities. At present, a mainstream anti-static measure is to design an electrostatic discharge (ESD) unit around the panel. The ESD unit is grounded to export the static electricity.

SUMMARY

Embodiments of the disclosure provide an array substrate, a display panel and a display apparatus.

An embodiment of the disclosure provides an array substrate, including: a plurality of gate lines, and a plurality of data lines intersecting with the plurality of gate lines, and a plurality of pixel units, where the plurality of gate lines and the plurality of data lines are arranged between at least part of adjacent pixel units.

The array substrate further includes: a plurality of common electrode lead wires and a common electrode layer located arranged on the plurality of common electrode lead wires.

The plurality of common electrode lead wires are arranged on a same layer as the plurality of data lines, extend in a same direction as the plurality of data lines, and are located between at least part of adjacent pixel units.

The common electrode layer is insulated from the plurality of common electrode lead wires through an insulating layer and is connected to the plurality of common electrode lead wires through via holes in the insulating layer; wherein the via holes are located in regions where the plurality of gate lines and the plurality of common electrode lead wires intersect.

The plurality of gate lines each include a linear portion extending in a first direction away from the via holes, and include a curved portion curvedly surrounding edges of the via holes close to the via holes, wherein the curved portion is an avoidance portion for avoiding the via holes.

In some embodiments, a shape of an orthographic projection of each of the via holes on a base substrate is circular or elliptical, and a shape of an orthographic projection of the avoidance portion on the base substrate is arc.

In some embodiments, the plurality of gate lines include: first gate lines and second gate lines.

The first gate lines are located on each row of the pixel units extending in the first direction, and the second gate lines are located below the each row of the pixel units extending in the first direction.

The first gate lines and the second gate lines extend in a same direction, and are located between two adjacent rows of the pixel units.

The first gate lines each include a first avoidance portion connected to the linear portion, and the second gate lines each include a second avoidance portion connected to the linear portion.

The first avoidance portion and the second avoidance portion surround two opposite edges of the via holes respectively.

The plurality of pixel units include: first pixel units and second pixel units arranged alternately; wherein the first pixel units include first thin film transistors; and the second pixel units include second thin film transistors.

The first gate lines are electrically connected to the first thin film transistors, and the second gate lines are electrically connected to the second thin film transistors.

In some embodiments, the array substrate further includes the base substrate; and the first thin film transistors and the second thin film transistors each include: a gate electrode, a gate insulating layer, an active layer, a source electrode, and a drain electrode arranged on the base substrate in sequence.

The gate lines are arranged on a same layer as the gate electrode; the common electrode lead wires are arranged on a same layer as the source electrode and the drain electrode; and the insulating layer includes a passivation layer located on the source electrode and the drain electrode.

In some embodiments, the common electrode lead wires each include: a plurality of connecting portions located in the regions where the plurality of gate lines and the plurality of common electrode lead wires intersect, and a first connecting lead wire extending in a second direction and connected with the plurality of connecting portions.

The common electrode layer is connected to the plurality of connecting portions through the via holes.

In the first direction, a width of each connecting portion is greater than a width of the first connecting lead wire.

The orthographic projections of the via holes on the base substrate fall into orthographic projections of the plurality of connecting portions on the base substrate; and in the first direction and the second direction, a width of each via hole is less than the width of the each connecting portion.

In some embodiments, an orthographic projection of the avoidance portion on the base substrate overlaps with the orthographic projections of the connecting portions on the base substrate.

In some embodiments, in the first direction, the widths of the connecting portions in at least part of regions are greater than a width of the avoidance portion.

In some embodiments, a distance between the orthographic projection of the avoidance portion on the base substrate and the orthographic projection of a via hole on the base substrate is greater than 0 and less than or equal to 2 microns.

An embodiment of the disclosure provides a display panel, including: the array substrate provided by the embodiments of the disclosure, an opposite substrate arranged opposite to the array substrate, and a liquid crystal layer arranged between the array substrate and the opposite substrate.

An embodiment of the disclosure provides a display apparatus, including the display panel provided by the embodiments of the disclosure.

BRIEF DESCRIPTION OF THE DRAWINGS

In order to more clearly illustrate the technical solutions in embodiments of the disclosure, the drawings used in the description of the embodiments are briefly described below. Obviously, the drawings in the description below are only

DETAILED DESCRIPTION OF THE EMBODIMENTS

In order to make objectives, technical solutions and advantages of embodiments of the disclosure clearer, the technical solutions of the embodiments of the disclosure will be clearly and fully described below in combination with the accompanying drawings of the embodiments of the disclosure. Obviously, the described embodiments are some, but not all of the embodiments of the disclosure. Without conflict, the embodiments of the disclosure and features in the embodiments may be combined with each other. On the basis of the described embodiments of the disclosure, all other embodiments obtained by those ordinarily skilled in the art without creative work belong to the protection scope of the disclosure.

Unless otherwise defined, technical or scientific terms used in the disclosure should be understood commonly by those ordinarily skilled in the art of the disclosure. "First", "second" and other similar words used in the disclosure do not denote any sequence, quantity or significance, but are only configured to distinguish different components. "Include", or "contain" and other similar words mean that components or items preceding the words cover components or items and their equivalents listed after the words without excluding other components or items. "Connection" or "joint" and other similar words are not limited to physical or mechanical connection but also include electrical connection in spite of being direct or indirect.

It should be noted that a size and a shape of each figure in the accompanying drawings do not reflect a true scale, but only for the purpose of schematically explaining the content of the disclosure, and the same or similar labels throughout represent the same or similar components or components with the same or similar functions.

Figure 1:
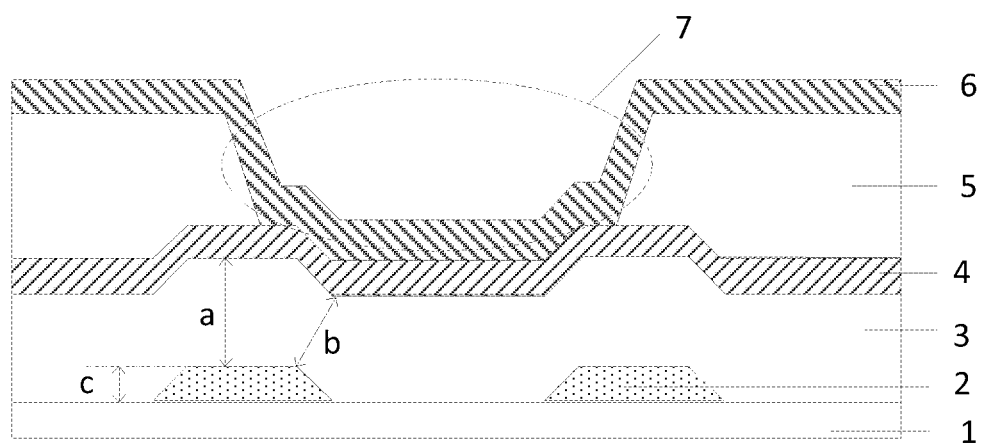
FIG. 1 is a schematic structural diagram of an array substrate in the related art.

In the related art, a sectional view of via holes in an array substrate is shown in FIG. 1. One or more passivation layers 5 have via holes 7 exposing a plurality of common electrode lead wires 4 in one or more regions where a plurality of gate lines 2 intersect the common electrode lead wires 4. A plurality of common electrode layers 6 are electrically connected to the common electrode lead wires 4 through the via holes 7. The via holes 7 are overlapped above the gate lines 2, so that step edges of the gate lines 2 and the common electrode lead wires 4 are formed in regions of the via holes 7. The gate lines 2 are closest to the common electrode lead wires 4 at a tip of a step. A distance between the gate lines 2 and the common electrode lead wires 4 at the tip of the step is b. Gate insulating layers 3 are arranged between the gate lines 2 and the common electrode lead wires 4. A thickness of the gate insulating layers 3 is a, a slope angle of the gate lines 2 is θ, and a thickness of the gate lines 2 is c, so that the distance b between the gate lines 2 and the common electrode lead wires 4 at the tip of the step is $(a-c)/\sin\theta$.

When the via holes are formed by etching, gas continuously etches passivation layer films at the via holes until the common electrode lead wires are exposed, gas ionization generates charge accumulation on the common electrode lead wires at the via holes, and the gate lines form a capacitance with the common electrode lead wires. When there is a voltage difference between the gate lines and the common electrode lead wires, an electric field is formed between the gate lines and the common electrode lead wires. According to an electric field intensity formula $E=U/d$, where U is a voltage difference between two electrodes, d is a distance between the two electrodes, and E is an electric field intensity. The smaller the distance d between the two electrodes is, the greater the electric field intensity E is. According to a tip discharge principle, under the action of a strong electric field, where a surface curvature of an object is larger, an equipotential density is larger, and the higher the surface charge density is, the greater the electric field intensity is. Covalent bonds in insulating layers are destroyed in the strong electric field to produce ionization. When an ionization quantity reaches a certain degree, the insulating layers are broken down, resulting in a short circuit between the gate lines and the common electrode lead wires.

Figure 2:
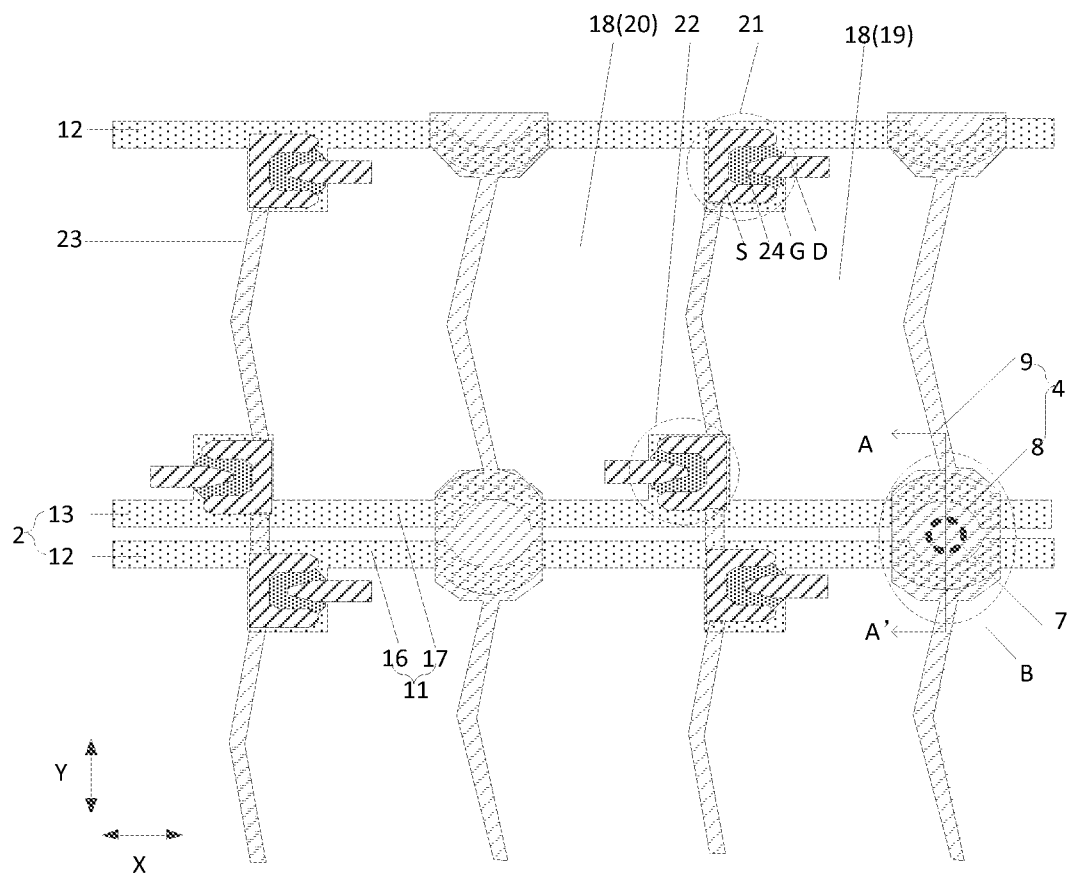
FIG. 2 is a schematic structural diagram of an array substrate provided by an embodiment of the disclosure.
Figure 3:
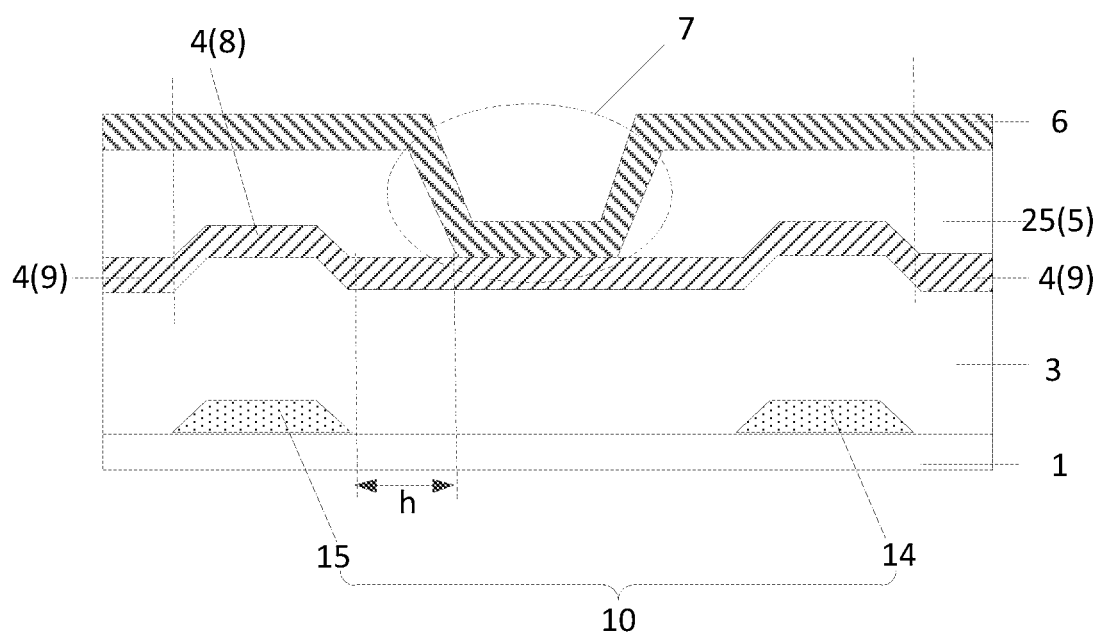
FIG. 3 is a sectional view along AA' in FIG. 2 provided by an embodiment of the disclosure.
Figure 4:
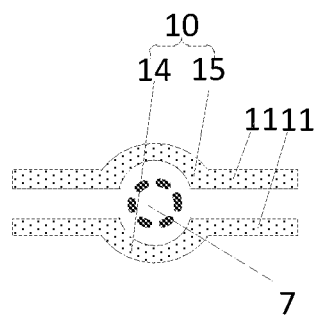
FIG. 4 is a top view of a gate line in a region B in FIG. 2 provided by an embodiment of the disclosure.

An embodiment of the disclosure provides an array substrate, as shown in FIG. 2, FIG. 3 and FIG. 4. The array substrate includes a plurality of gate lines 2, a plurality of data lines 23 which are intersecting with the plurality of gate lines, and a plurality of pixel units 18. The gate lines 2 and the data lines 23 are arranged between at least part of the adjacent pixel units 18.

The array substrate further includes one or more common electrode lead wires 4 and one or more common electrode layers 6 located on the common electrode lead wires 4.

The common electrode lead wires 4 are arranged on a same layer as the data lines 23, extend in a same direction as the data lines 23, and are located between at least part of the adjacent pixel units 18.

The one or more common electrode layers 6 are insulated from the common electrode lead wires 4 through one or more insulating layers 25 and are connected to the common electrode lead wires 4 through via holes 7 in the one or more insulating layers 25, where the via holes 7 are located in one or more regions (as shown in FIG. 2, the region B) where the gate lines 2 and the common electrode lead wires 4 intersect.

The gate lines 2 each include a linear portion 11 extending in a first direction X away from the via holes 7 and further include a curved portion curvedly surrounding edges of the via holes 7 close to the via holes, and the curved portions are avoidance portions 10 for avoiding the via holes.

FIG. 3 is a sectional view along AA' in FIG. 2. FIG. 4 is a top view of a gate line in a region B in FIG. 2. The common electrode layers are not shown in FIG. 2. In some embodiments, a common voltage signal can be provided to the common electrode layers through the common electrode lead wires.

According to the array substrate provided by the embodiments of the disclosure, the gate lines include the avoidance portions that avoid regions where the via holes are located, that is, orthographic projections of the avoidance portions on a base substrate are located outside orthographic projections of the via holes on the base substrate, and the avoidance portions bypass regions corresponding to the via holes. Therefore, in the regions corresponding to the via holes, a distance between each avoidance portion and each common electrode lead wire increases. Even after a process of forming the via holes, charge accumulation is generated at the common electrode lead wires exposed by the via holes, compared with a related technology, an electric field intensity between the gate lines and the common electrode lead wires is reduced, which will not lead to a breakdown of the gate insulating layers, so as to avoid the short circuit between the gate lines and the common electrode lead wires caused by the electrostatic breakdown of the gate insulating layers and avoid poor display.

In some embodiments, as shown in FIG. 2, the common electrode lead wires 4 extend in a second direction Y; and as shown in FIG. 2, the first direction X and the second direction Y are perpendicular.

In some embodiments, as shown in FIG. 4, a shape of the orthographic projection of each via hole 7 on the base substrate is circular or elliptical, and a shape of the orthographic projection of each avoidance portion 10 on the base substrate is arc.

According to the array substrate provided by the embodiment of the disclosure, the shape of the orthographic projection of each via hole on the base substrate is circular, and the shape of the orthographic projection of each avoidance portion on the base substrate is arc, so that without changing setting positions of the linear portions of the gate lines, a space of the intersection region between the gate lines and the common electrode lead wires can be reasonably used to avoid the region corresponding to the via holes, avoid an increase of an area of a non-display region between the pixel units, and ensure an opening rate of display products.

In some embodiments, as shown in FIG. 2, FIG. 3 and FIG. 4, the gate lines 2 include first gate lines 12 and second gate lines 13.

The first gate lines 12 are located on each row of the pixel units 18, and the second gate lines 13 are located below each row of the pixel units 18.

The first gate lines 12 and the second gate lines 13 extend in a same direction, and are located between two adjacent rows of the pixel units 18.

The first gate lines 12 include first avoidance portions 14 connected to the linear portions 11, and the second gate lines 13 include second avoidance portions 15 connected to the linear portions 11.

The first avoidance portions 14 and the second avoidance portions 15 surround two opposite edges of the via holes 7 respectively.

The plurality of pixel units 18 include first pixel units 19 and second pixel units 20 which are arranged alternately.

The first pixel units 19 further include first thin film transistors 21; and the second pixel units 19 further include second thin film transistors 22.

The first gate lines 12 are electrically connected to the first thin film transistors 21, and the second gate lines 13 are electrically connected to the second thin film transistors 22.

The array substrate provided by the embodiment of the disclosure is designed by adopting a Dual Gate. In some embodiments, as shown in FIG. 2, the first gate lines 12 are configured to drive the first pixel units 19; the second gate lines 13 are configured to drive the second pixel units 20; and the adjacent first pixel unit 19 and the second pixel unit 20 in the first direction X are electrically connected to the same data line 23 so that the number of data lines can be reduced, and then the number of driving chips can be reduced, so as to reduce the cost of the driving chips.

The array substrate is divided into a display region and a peripheral region outside the display region. FIG. 2 illustrates that the via holes connecting the common electrode layers with the common electrode lead wires in the insulating layers are located in the display region as an example.

In some embodiments, the common electrode layers and the common electrode lead wires extend to the peripheral region, and the insulating layers in the peripheral region have the via holes connecting the common electrode layers with the common electrode lead wires so that the common voltage signal can be provided for the common electrode layers through the common electrode lead wires. However, in order to ensure the uniformity of the common voltage signal of the common electrode layers, the display region also needs to be provided with the via holes to connect the common electrode layers with the common electrode lead wires.

In some embodiments, the array substrate provided by the embodiment of the disclosure is applied to liquid crystal display. Two layers of indium tin oxide (ITO) need to be successively arranged on a metal layer where the common electrode lead wires are located. The two layers of ITO are the common electrode layer and a pixel electrode layer respectively. For liquid crystal display products of an HADS mode, the second ITO layer is used as the common electrode layer, so that the via holes must be set to make the common electrode layer in contact with the common electrode lead wires, and then the common voltage signal can be provided for the common electrode layer through the common electrode lead wires. A Dual Gate design is adopted, the common electrode lead wires are arranged on a same layer as the data lines and source electrodes and drain electrodes of thin film transistors, the gate lines and the common electrode lead wires must overlap each other, and an overlapping region of the gate lines and the common electrode lead wires corresponds to a black matrix setting region of an opposite substrate, i.e., the non-display region between the pixel units, so that the via holes connecting the common electrode layer with the common electrode lead wires are arranged in the region where the gate lines and the common electrode lead wires overlap. Therefore, the region between the pixel units can be reasonably used to avoid the increase of the area of the non-display region between the pixel units, so as to avoid losing the opening rate and a contrast of the display products.

In some embodiments, as shown in FIG. 2 and FIG. 3, the array substrate further includes a base substrate 1; and the first thin film transistors 21 and the second thin film transistors 22 each include: gate electrodes G, gate insulating layers 3, active layers 24, source electrodes S, and drain electrodes D which are arranged above the base substrate 1 in sequence.

The gate lines 2 are arranged on a same layer as the gate electrodes G; the common electrode lead wires 4 are arranged on a same layer as the source electrodes S and the drain electrodes D; and the insulating layers 25 each include a passivation layer 5 located on the source electrodes and the drain electrodes.

In the array substrate provided by the embodiment of the disclosure, the first thin film transistors and the second thin film transistors are of bottom gate structures. Of course, the first thin film transistors and the second thin film transistors may also be of top gate structures.

In some embodiments, as shown in FIG. 2, the gate electrodes of the first thin film transistors 21 are in electric connection with the first gate lines 12, and the gate electrodes of the second thin film transistors 22 are in electric connection with the second gate lines 13.

In some embodiments, as shown in FIG. 2, the data lines 23 are in electric connection with the source electrodes S of the first thin film transistors 21 and the source electrodes S of the second thin film transistors 22.

In some embodiments, pixel electrodes are in electric connection with the drain electrodes, and there is overlap between the pixel electrodes and common electrodes.

In some embodiments, as shown in FIG. 2, two columns of the pixel units 18 are included between two adjacent common electrode lead wires 4.

In some embodiments, as shown in FIG. 2 and FIG. 3, each common electrode lead wire 4 includes: a plurality of connecting portions 8 located in the regions where the gate lines 2 and the common electrode lead wires 4 intersect, and a first connecting lead wire 9 which is in electric connection with the connecting portions 8.

The common electrode layers 6 are connected with the connecting portions 8 through the via holes 7.

In the first direction X, a width of each connecting portion 8 is greater than a width of each first connecting lead wire 9.

The orthographic projections of the via holes 7 on the base substrate 1 fall into orthographic projections of the connecting portions 8 on the base substrate 1; and in the first direction X and the second direction Y, a width of each via hole 7 is less than the width of each connecting portion 8.

According to the array substrate provided by the embodiment of the disclosure, in the first direction and the second direction, the width of each via hole is less than the width of each connecting portion so that it can ensure that the common electrodes and the connecting portions are fully overlapped in the via holes, so as to avoid poor overlapping between the common electrodes and the connecting portions.

In some embodiments, the connecting portions are integrally formed with the first connecting lead wires.

In some embodiments, as shown in FIG. 2 and FIG. 3, the orthographic projections of the avoidance portions 10 on the base substrate 1 overlap with the orthographic projections of the connecting portions 8 on the base substrate 1.

According to the array substrate provided by the embodiments of the disclosure, the orthographic projections of the avoidance portions on the base substrate overlap with the orthographic projections of the connecting portions on the base substrate, so that the space of the intersection region between the gate lines and the common electrode lead wires can be reasonably used to avoid the increase of the area of the non-display region and ensure the opening rate of the display products.

In some embodiments, as shown in FIG. 2, in the first direction X, the widths of the connecting portions 8 in at least part of regions are greater than widths of the avoidance portions.

Figure 5:
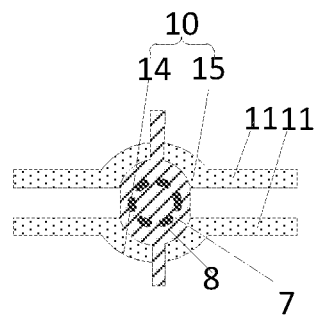
FIG. 5 is a structural top view of another array substrate provided by an embodiment of the disclosure.

In some embodiments, as shown in FIG. 5, the orthographic projections of the avoidance portions 10 on the base substrate and the orthographic projections of the connecting portions 8 on the base substrate do not overlap each other.

In some embodiments, as shown in FIG. 2, a pattern of the orthographic projections of the connecting portions of the common electrode lead wires 4 on the base substrate is in an island shape. Of course, in specific implementation, the pattern of the connecting portions can also be circular, rectangular and other shapes, which is not limited in the disclosure.

In some embodiments, as shown in FIG. 3, a distance h between the orthographic projection of each avoidance portion 10 on the base substrate and the orthographic projection of each via hole 7 on the base substrate is greater than 0 and less than or equal to 2 microns.

According to the array substrate provided by the embodiment of the disclosure, the distance between the orthographic projection of each avoidance portion on the base substrate and the orthographic projection of each via hole on the base substrate is greater than 0 and less than or equal to 2 microns so that a spacing between the orthographic projections of the via holes and the orthographic projections of the gate lines can be ensured, and the distance between edges of the via holes and the gate lines can be further increased, so as to increase the distance between the gate lines and the common electrode lead wires in the region corresponding to the via holes, avoid the breakdown of the gate insulating layers, and avoid the short circuit between the gate lines and the common electrode lead wires caused by the electrostatic breakdown of the gate insulating layers. At the same time, it can also avoid an excessive size of the region where the gate lines and the common electrode lead wires overlap, avoid the increase of the area of the non-display region between the pixel units of the display products, and ensure the opening rate of the display products.

An embodiment of the disclosure further provides a display panel, including the array substrate provided by the embodiments of the disclosure, an opposite substrate arranged opposite to the array substrate, and a liquid crystal layer arranged between the array substrate and the opposite substrate.

The display panel provided by the embodiments of the disclosure is a liquid crystal display panel.

An embodiment of the disclosure provides a display apparatus, including the display panel provided by the embodiments of the disclosure.

The display apparatus provided by the embodiment of the disclosure may be a mobile phone, a tablet computer, a TV, a display, a notebook computer, a digital photo frame, a navigator or other products or components with a display function. Other essential components of the display apparatus should be understood by those skilled in the art, and will not be repeated here, nor should it be used as a limitation of the disclosure. The implementation of the display apparatus may refer to the above embodiment of the array substrate, and the repetition will not be repeated.

To sum up, the embodiments of the disclosure provide the array substrate, the display panel and the display apparatus. The gate lines include the avoidance portions that avoid regions where the via holes are located, that is, the orthographic projections of the avoidance portions on the base substrate are located outside the orthographic projections of the via holes on the base substrate, and the avoidance portions bypass the regions corresponding to the via holes. Therefore, in the regions corresponding to the via holes, the distance between each avoidance portion and each common electrode lead wire increases. Even after the process of forming the via holes, the charge accumulation is generated at the common electrode lead wires exposed by the via holes, compared with the related technology, the electric field intensity between the gate lines and the common electrode lead wires is reduced, which will not lead to the breakdown of the gate insulating layers, so as to avoid the short circuit between the gate lines and the common electrode lead wires caused by the electrostatic breakdown of the gate insulating layers and avoid poor display.

What is claimed is:

1. An array substrate, comprising:
a plurality of gate lines;
a plurality of data lines intersecting with the plurality of gate lines;

a plurality of pixel units, wherein the plurality of gate lines and the plurality of data lines are arranged between at least part of adjacent pixel units;
a plurality of common electrode lead wires; and
a common electrode layer arranged on the plurality of common electrode lead wires;
wherein the plurality of common electrode lead wires are arranged on a same layer as the plurality of data lines, extend in a same direction as the plurality of data lines, and are located between at least part of adjacent pixel units;
the common electrode layer is insulated from the plurality of common electrode lead wires through an insulating layer and is connected to the plurality of common electrode lead wires through via holes in the insulating layer, wherein the via holes are located in regions where the plurality of gate lines and the plurality of common electrode lead wires intersect; and
the plurality of gate lines each comprise a linear portion extending in a first direction away from the via holes, and comprise a curved portion curvedly surrounding edges of the via holes close to the via holes, wherein the curved portion is an avoidance portion for avoiding the via holes.

2. The array substrate according to claim 1, wherein a shape of an orthographic projection of each of the via holes on a base substrate is circular or elliptical, and a shape of an orthographic projection of the avoidance portion on the base substrate is arc.

3. The array substrate according to claim 1, wherein the plurality of gate lines comprise: first gate lines and second gate lines, wherein:
the first gate lines are located on each row of the pixel units extending in the first direction, and the second gate lines are located below the each row of the pixel units extending in the first direction;
the first gate lines and the second gate lines extend in a same direction, and are located between two adjacent rows of the pixel units;
the first gate lines each comprise a first avoidance portion connected to the linear portion, and the second gate lines each comprise a second avoidance portion connected to the linear portion;
the first avoidance portion and the second avoidance portion surround two opposite edges of the via holes respectively;
the plurality of pixel units comprise: first pixel units and second pixel units arranged alternately, wherein the first pixel units comprise first thin film transistors, and the second pixel units comprise second thin film transistors; and
the first gate lines are electrically connected to the first thin film transistors, and the second gate lines are electrically connected to the second thin film transistors.

4. The array substrate according to claim 3, further comprising: a base substrate; the first thin film transistors and the second thin film transistors each comprise: a gate electrode, a gate insulating layer, an active layer, a source electrode, and a drain electrode arranged on the base substrate in sequence; and
the gate lines are arranged on a same layer as the gate electrode, the common electrode lead wires are arranged on a same layer as the source electrode and the drain electrode, and the insulating layer comprises a passivation layer located on the source electrode and the drain electrode.

5. The array substrate according to claim 1, wherein the common electrode lead wires each comprise: a plurality of connecting portions located in the regions where the plurality of gate lines and the plurality of common electrode lead wires intersect, and a first connecting lead wire extending in a second direction and connected with the plurality of connecting portions;
the common electrode layer is connected to the plurality of connecting portions through the via holes;
in the first direction, a width of each connecting portion is greater than a width of the first connecting lead wire; and
orthographic projections of the via holes on a base substrate fall into orthographic projections of the plurality of connecting portions on the base substrate, and in the first direction and the second direction, a width of each via hole is less than the width of the each connecting portion.

6. The array substrate according to claim 5, wherein an orthographic projection of the avoidance portion on the base substrate overlaps with the orthographic projections of the connecting portions on the base substrate.

7. The array substrate according to claim 6, wherein in the first direction, the widths of the connecting portions in at least part of regions are greater than a width of the avoidance portion.

8. The array substrate according to claim 1, wherein a distance between an orthographic projection of the avoidance portion on a base substrate and an orthographic projection of a via hole on the base substrate is greater than 0 and less than or equal to 2 microns.

9. A display panel, comprising: an array substrate, an opposite substrate arranged opposite to the array substrate, and a liquid crystal layer arranged between the array substrate and the opposite substrate; wherein the array substrate comprises:
a plurality of gate lines;
a plurality of data lines intersecting with the plurality of gate lines;
a plurality of pixel units, wherein the plurality of gate lines and the plurality of data lines are arranged between at least part of adjacent pixel units;
a plurality of common electrode lead wires; and
a common electrode layer arranged on the plurality of common electrode lead wires;
wherein the plurality of common electrode lead wires are arranged on a same layer as the plurality of data lines, extend in a same direction as the plurality of data lines, and are located between at least part of adjacent pixel units;
the common electrode layer is insulated from the plurality of common electrode lead wires through an insulating layer and is connected to the plurality of common electrode lead wires through via holes in the insulating layer, wherein the via holes are located in regions where the plurality of gate lines and the plurality of common electrode lead wires intersect; and
the plurality of gate lines each comprise a linear portion extending in a first direction away from the via holes, and comprise a curved portion curvedly surrounding edges of the via holes close to the via holes, wherein the curved portion is an avoidance portion for avoiding the via holes.

10. The display panel according to claim 9, wherein a shape of an orthographic projection of each of the via holes on a base substrate is circular or elliptical, and a shape of an orthographic projection of the avoidance portion on the base substrate is arc.

11. The display panel according to claim 9, wherein the plurality of gate lines comprise: first gate lines and second gate lines, wherein:
- the first gate lines are located on each row of the pixel units extending in the first direction, and the second gate lines are located below the each row of the pixel units extending in the first direction;
- the first gate lines and the second gate lines extend in a same direction, and are located between two adjacent rows of the pixel units;
- the first gate lines each comprise a first avoidance portion connected to the linear portion, and the second gate lines each comprise a second avoidance portion connected to the linear portion;
- the first avoidance portion and the second avoidance portion surround two opposite edges of the via holes respectively;
- the plurality of pixel units comprise: first pixel units and second pixel units arranged alternately, wherein the first pixel units comprise first thin film transistors, and the second pixel units comprise second thin film transistors; and
- the first gate lines are electrically connected to the first thin film transistors, and the second gate lines are electrically connected to the second thin film transistors.

12. The display panel according to claim 11, further comprising: a base substrate; the first thin film transistors and the second thin film transistors each comprise: a gate electrode, a gate insulating layer, an active layer, a source electrode, and a drain electrode arranged on the base substrate in sequence; and
- the gate lines are arranged on a same layer as the gate electrode, the common electrode lead wires are arranged on a same layer as the source electrode and the drain electrode, and the insulating layer comprises a passivation layer located on the source electrode and the drain electrode.

13. The display panel according to claim 9, wherein the common electrode lead wires each comprise: a plurality of connecting portions located in the regions where the plurality of gate lines and the plurality of common electrode lead wires intersect, and a first connecting lead wire extending in a second direction and connected with the plurality of connecting portions;
- the common electrode layer is connected to the plurality of connecting portions through the via holes;
- in the first direction, a width of each connecting portion is greater than a width of the first connecting lead wire; and
- orthographic projections of the via holes on a base substrate fall into orthographic projections of the plurality of connecting portions on the base substrate, and in the first direction and the second direction, a width of each via hole is less than the width of the each connecting portion.

14. The display panel according to claim 13, wherein an orthographic projection of the avoidance portion on the base substrate overlaps with the orthographic projections of the connecting portions on the base substrate.

15. The display panel according to claim 14, wherein in the first direction, the widths of the connecting portions in at least part of regions are greater than a width of the avoidance portion.

16. The display panel according to claim 9, wherein a distance between an orthographic projection of the avoidance portion on a base substrate and an orthographic projection of a via hole on the base substrate is greater than 0 and less than or equal to 2 microns.

17. A display apparatus, comprising: a display panel comprising an array substrate, an opposite substrate arranged opposite to the array substrate, and a liquid crystal layer arranged between the array substrate and the opposite substrate; wherein the array substrate comprises:
- a plurality of gate lines;
- a plurality of data lines intersecting with the plurality of gate lines;
- a plurality of pixel units, wherein the plurality of gate lines and the plurality of data lines are arranged between at least part of adjacent pixel units;
- a plurality of common electrode lead wires; and
- a common electrode layer arranged on the plurality of common electrode lead wires;
- wherein the plurality of common electrode lead wires are arranged on a same layer as the plurality of data lines, extend in a same direction as the plurality of data lines, and are located between at least part of adjacent pixel units;
- the common electrode layer is insulated from the plurality of common electrode lead wires through an insulating layer and is connected to the plurality of common electrode lead wires through via holes in the insulating layer, wherein the via holes are located in regions where the plurality of gate lines and the plurality of common electrode lead wires intersect; and
- the plurality of gate lines each comprise a linear portion extending in a first direction away from the via holes, and comprise a curved portion curvedly surrounding edges of the via holes close to the via holes, wherein the curved portion is an avoidance portion for avoiding the via holes.

* * * * *